United States Patent
Liu et al.

(10) Patent No.: US 9,338,902 B2
(45) Date of Patent: May 10, 2016

(54) ELECTRONIC DEVICE WITH SUPPORT

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Mei-Hua Liu, Shenzhen (CN); Te-Hsu Wang, New Taipei (TW); Chih-Kang Cho, New Taipei (TW); Chun Liu, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

(*) Notice: Subject to any disclaimer, the term of this patent is extended or adjusted under 35 U.S.C. 154(b) by 0 days.

(21) Appl. No.: 14/541,395

(22) Filed: Nov. 14, 2014

(65) Prior Publication Data

US 2015/0131214 A1    May 14, 2015

(30) Foreign Application Priority Data

Nov. 14, 2013  (CN) .......................... 2013 1 0565491

(51) Int. Cl.
| | |
|---|---|
| H05K 5/02 | (2006.01) |
| H01R 13/625 | (2006.01) |
| F16M 11/04 | (2006.01) |
| F16M 11/10 | (2006.01) |
| F16M 11/22 | (2006.01) |
| B60R 11/00 | (2006.01) |

(52) U.S. Cl.
CPC ........... *H05K 5/0204* (2013.01); *F16M 11/041* (2013.01); *F16M 11/10* (2013.01); *F16M 11/22* (2013.01); *H01R 13/625* (2013.01); *H05K 5/0234* (2013.01); *B60R 2011/0066* (2013.01); *B60R 2011/0073* (2013.01)

(58) Field of Classification Search
CPC ............... H05K 5/0204; H01R 13/625; B60R 2011/0073; B60R 2011/0066
USPC ........................................ 248/222.14, 221.12
See application file for complete search history.

(56) References Cited

U.S. PATENT DOCUMENTS

| | | | | |
|---|---|---|---|---|
| 4,725,029 | A * | 2/1988 | Herve ..................... | B60R 11/00 248/221.12 |
| 6,484,994 | B2 * | 11/2002 | Hokugoh ............... | F16M 11/10 248/371 |
| 6,935,883 | B2 * | 8/2005 | Oddsen, Jr. .......... | H01R 13/625 248/274.1 |

(Continued)

*Primary Examiner* — Terrell McKinnon
*Assistant Examiner* — Eret McNichols
(74) *Attorney, Agent, or Firm* — Novak Druce Connolly Bove + Quigg LLP (57) ABSTRACT

An electronic device with supporting structure includes a connection member, a back shell, two first fixing portions, and two second fixing portions. The connection member is attached to the supporting structure and defines two connection holes. Each connection hole includes a first through hole and a second through hole. A diameter of the second through hole is greater than that of the first through hole. The two first fixing portions are protruding from the back shell and are slidable between the second through holes and the first through holes. The two second fixing portions are attached to the two first fixing portions and can pass through the two second through holes. The connection member can prevent the two second fixing portions passing through the first through holes when the first fixing portions slide to the first through holes.

11 Claims, 6 Drawing Sheets

(56) References Cited

U.S. PATENT DOCUMENTS

| | | | | |
|---|---|---|---|---|
| D561,189 S * | 2/2008 | Wohlford | ................... | D14/451 |
| 7,726,617 B2 * | 6/2010 | Zambelli | ................ | F16M 11/04 248/222.12 |
| 7,766,296 B2 * | 8/2010 | Choi | ................ | F16M 11/10 248/176.1 |
| 8,083,193 B2 * | 12/2011 | Matsui | ................ | F16M 11/04 248/221.11 |
| 8,172,190 B2 * | 5/2012 | Dang et al. | ................ | 248/316.7 |
| 8,245,992 B2 * | 8/2012 | Matsui | ................ | F16M 11/10 248/224.51 |
| 8,251,325 B2 * | 8/2012 | Molter | ................ | F16M 11/105 248/221.12 |
| 8,888,062 B2 * | 11/2014 | Novin | ................ | F16M 11/04 248/274.1 |
| 9,042,092 B2 * | 5/2015 | Lu | ................ | F16M 11/041 248/917 |
| 9,161,465 B2 * | 10/2015 | Chen et al. | | |
| 9,213,288 B2 * | 12/2015 | Maeda | | |
| 9,215,816 B2 * | 12/2015 | You | | |
| 2004/0118987 A1 * | 6/2004 | Matko | ................ | B60R 11/0235 248/282.1 |
| 2004/0211870 A1 * | 10/2004 | Bremmon | ................ | F16M 11/10 248/284.1 |
| 2004/0232298 A1 * | 11/2004 | Bremmon | ................ | F16M 11/10 248/281.11 |
| 2005/0127260 A1 * | 6/2005 | Dittmer | ................ | F16M 11/04 248/221.11 |
| 2006/0038104 A1 * | 2/2006 | Choi | ................ | F16M 11/00 248/370 |
| 2010/0193650 A1 * | 8/2010 | Dittmer | ................ | F16M 11/04 248/222.51 |
| 2015/0138118 A1 * | 5/2015 | Liu | ................ | G06F 3/0412 345/173 |
| 2015/0146358 A1 * | 5/2015 | Yu | ................ | G06F 1/1601 361/679.21 |

* cited by examiner

ELECTRONIC DEVICE WITH SUPPORT

CROSS-REFERENCE TO RELATED APPLICATIONS

This application claims priority to Chinese Patent Application No. 201310565491.X filed on Nov. 14, 2013, in the China Intellectual Property Office, the contents of which are incorporated by reference herein.

FIELD

The present disclosure relates to structural supports for electronic devices.

BACKGROUND

Portable electronic devices such as display devices usually include a housing for receiving a display panel and a support connected to the housing. The support is attached to the housing by screws. Thus, a tool is needed to assemble the support to the housing or disassemble the support from the housing.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 1:
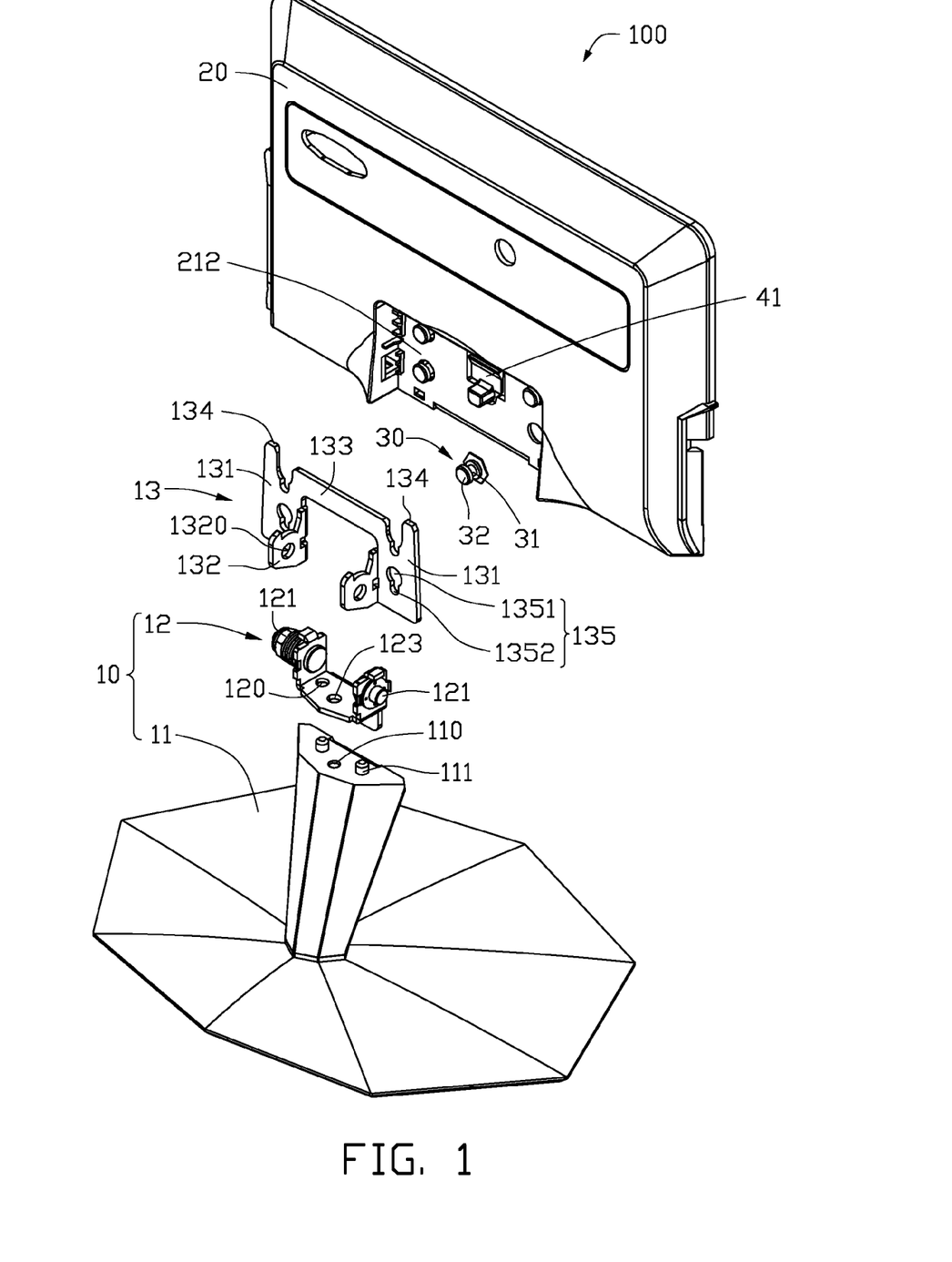
FIG. 1 is an exploded isometric view of an electronic device.
Figure 2:
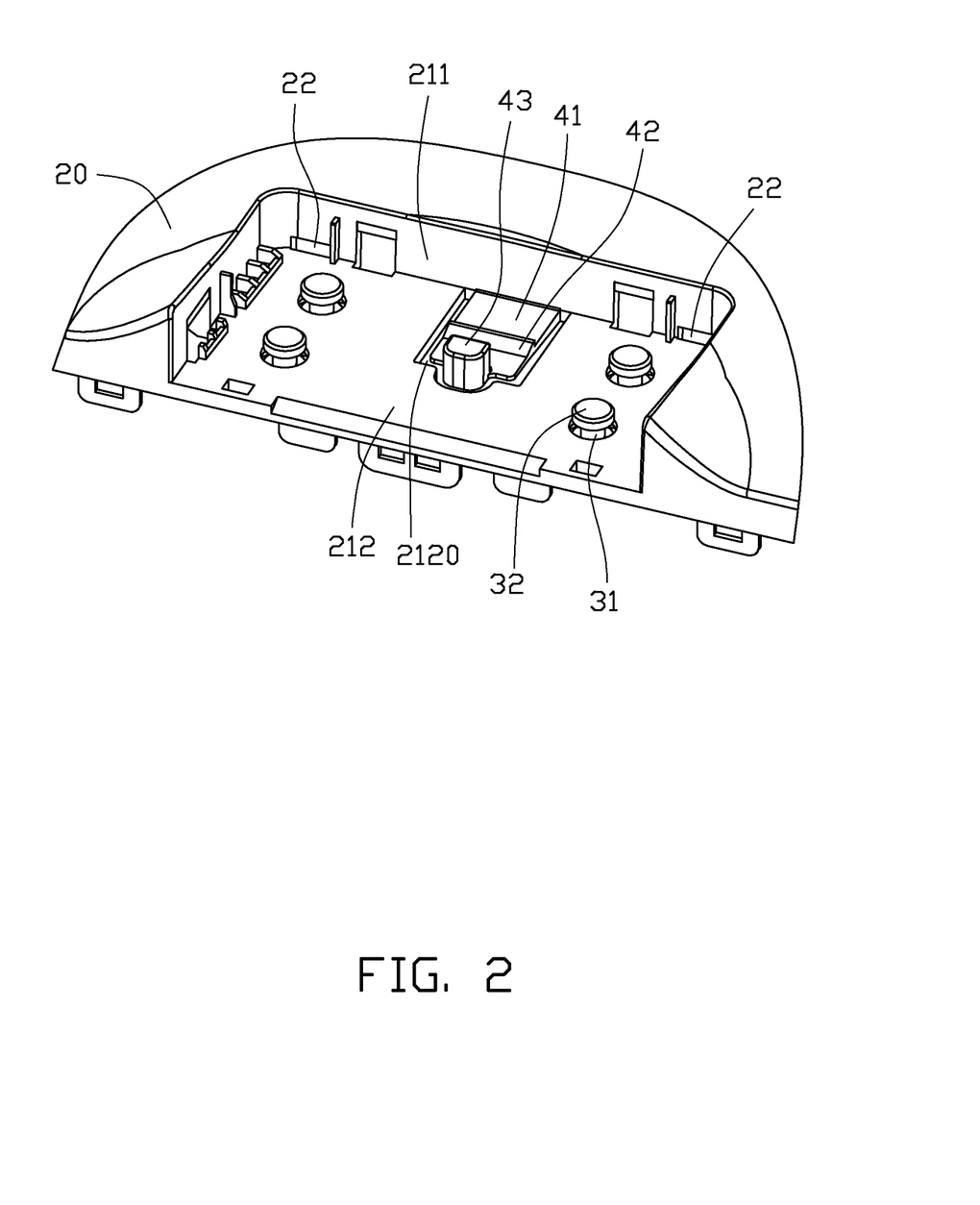
FIG. 2 is an isometric view of a back shell of the electronic device in FIG. 1.

FIGS. 1 and 2 illustrate an electronic device 100 which includes a back shell 20, a supporting structure 10 and a connection member 13. The back shell 20 is slidably attached to the connection member 13. The connection member 13 is coupled to the back shell 20.

The connection member 13 includes two first installing plates 131 and a connection plate 133 attached between the two first installing plates 131. Each first installing plate 131 defines a connection hole 135. The connection hole 135 includes a first through hole 1352 and a second through hole 1351 communicating with the first through hole 1352. The first through hole 1352 is adjacent to the supporting structure 10. The second through hole 1351 is distanced from the supporting structure 10. A diameter of the second through hole 1351 is greater than that of the first through hole 1352.

The back shell 20 defines a base plate 212 parallel to the connection member 13. Two fixing members 30 protruding from the base plate 212 and are aligned with the two connection holes 135. The fixing member 30 includes a first fixing portion 31 and a second fixing portion 32 attached to the first fixing portion 31. The first fixing portion 31 is adjacent to the base plate 212. The second fixing portion 32 is distanced from the base plate 212.

Figure 3:
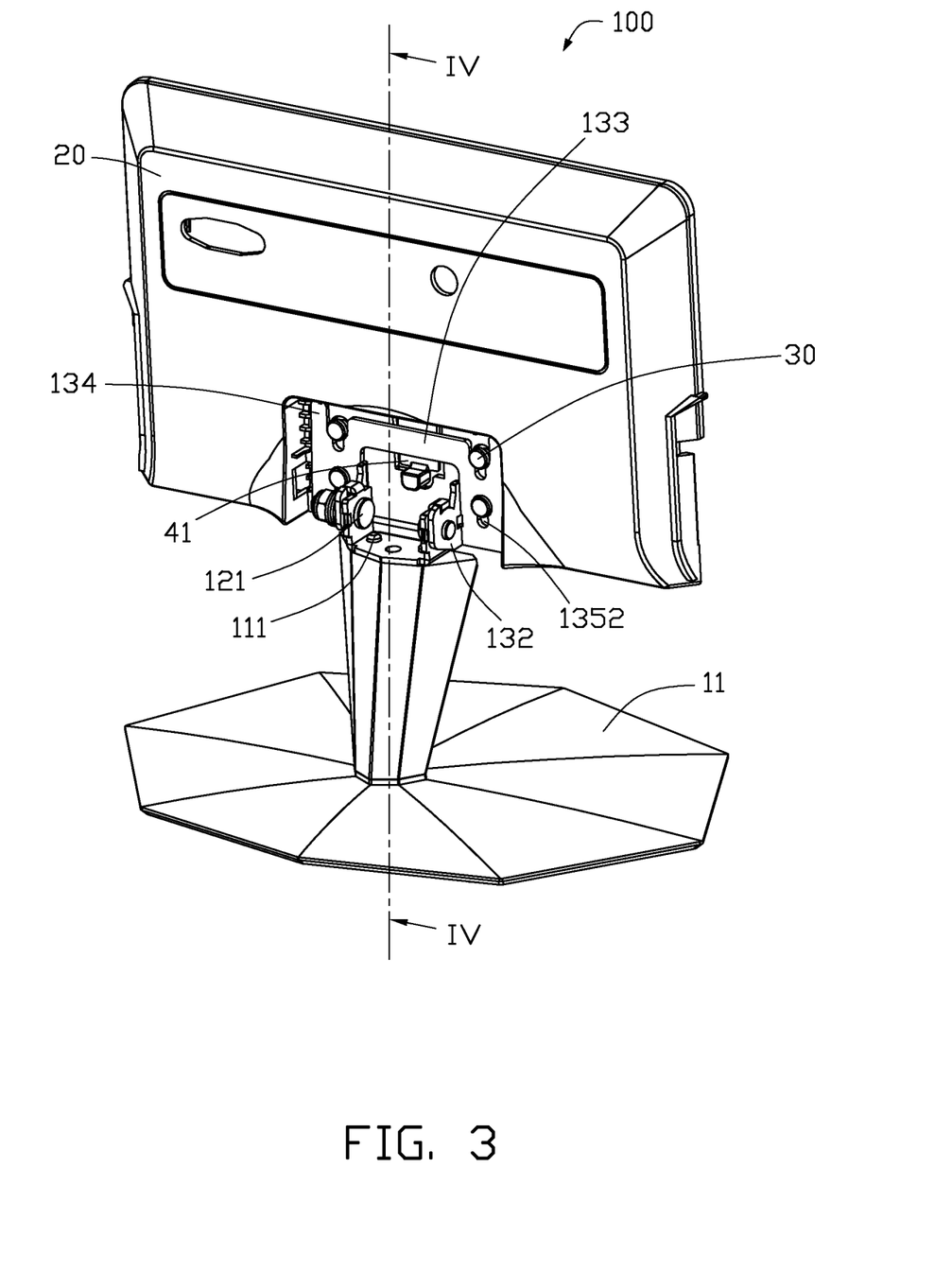
FIG. 3 is an isometric view of the electronic device in FIG. 1, with a clasping piece in a first position.
Figure 5:
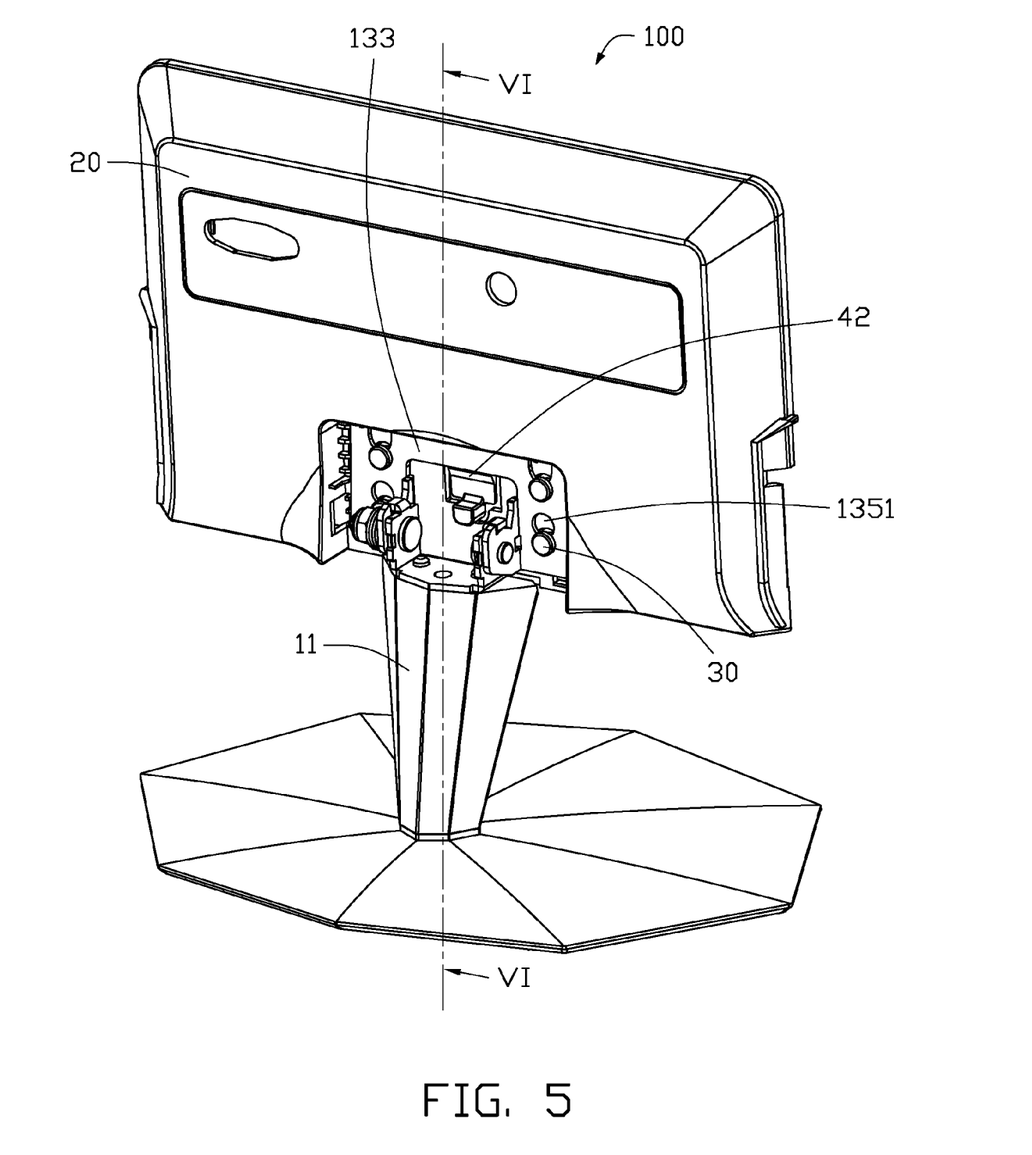
FIG. 5 is similar to FIG. 3, but with the clasping piece in a second position.

FIG. 3 illustrates that the second fixing portion 32 can pass through the second through hole 1351 to be positioned at a side of the first installing plate 131 away from the base plate 212. FIG. 5 illustrates that the first fixing portion 31 is slidable between the second through hole 1351 and the first through hole 1352. Thus, when the second fixing portion 32 passes through the second through hole 1351, the fixing member 30 can slide out from the second through hole 1351 and the first through hole 1352. The diameter of the second fixing portion 32 is greater than that of the first through hole 1352. Thus, when the fixing member 30 is positioned in the first through hole 1352, the first installing plate 131 can prevent the second fixing portion 32 passing through the first through hole 1352. When disassembling the back shell 20 from the connection member 13, the fixing member 30 is pushed to slide from the first through hole 1352 to the second through hole 1351. The second fixing portion 32 can pass through the second through hole 1351 to be positioned a side of the first installing plate 131 adjacent to the back shell 20. Thus, the connection member 13 can be disassembled from the back shell 20.

Figure 4:
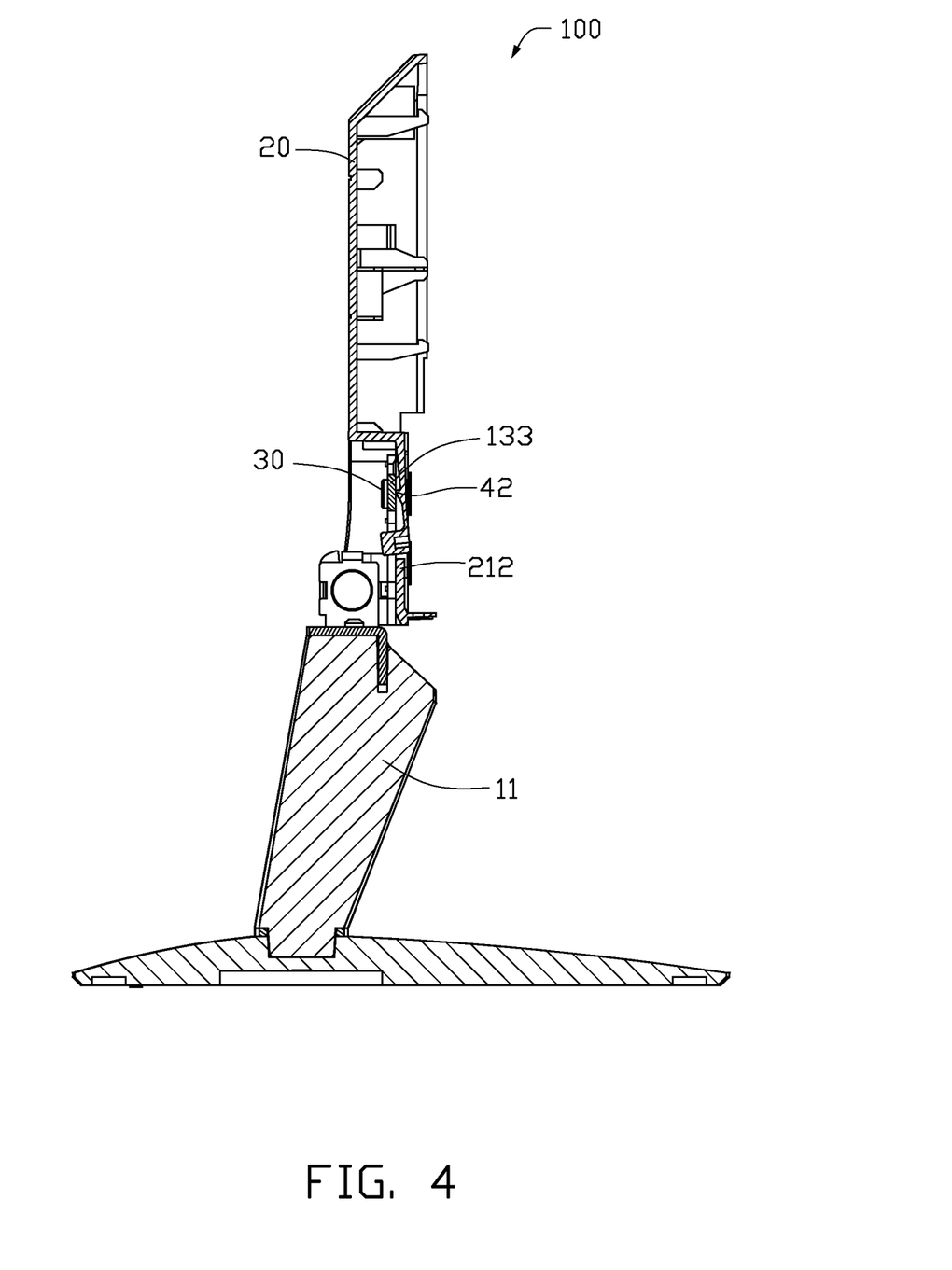
FIG. 4 is cross-sectional view taken along the line IV-IV in FIG. 3.
Figure 6:
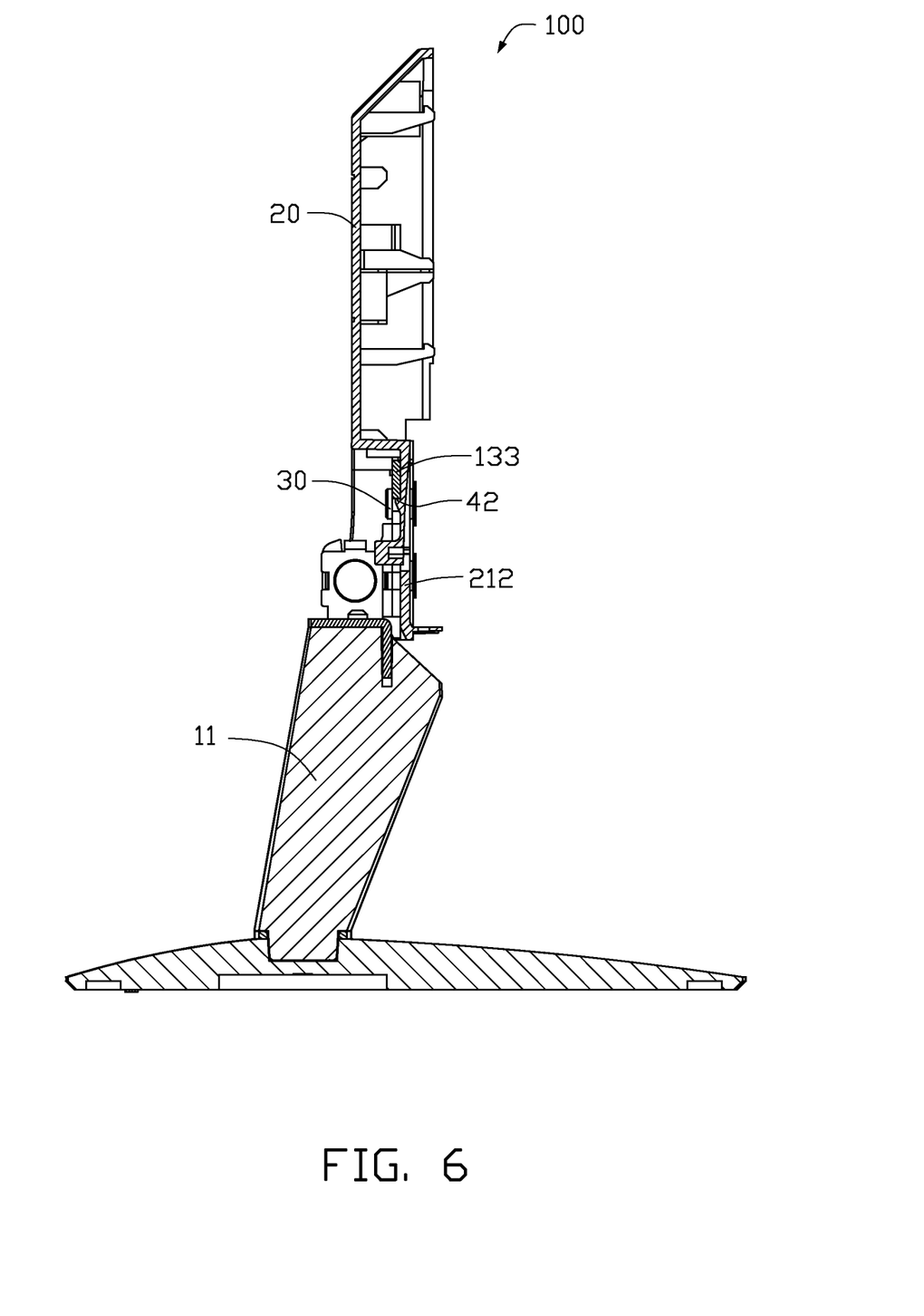
FIG. 6 is cross-sectional view taken along the line VI-VI in FIG. 5.

FIGS. 4 and 6 illustrate that the electronic device 100 further includes an elastic piece 41 attached to the back shell 20. A protrusion 42 protrudes from the elastic piece 41 The connection plate 133 is supported by the protrusion 42 when the first installing portion 31 is received in the first through hole 1352. The elastic piece 41 can be compressed to move away from the connection member 13, to release the protrusion 42 from the connection plate 133. Thus, the first installing portion 31 can be pushed from the first through hole 1352 to the second through hole 1351.

In at least one embodiment, the back shell 20 includes a ceiling plate 211 protruding from an edge of the base plate 212 which is away from the support 11. The elastic piece 41 includes a first end attached to the ceiling plate 212 and a distal end opposite to the first end of the elastic piece 41. An accessible pressing portion 43 protrudes from the distal end of the elastic piece 41. The base plate 212 defines a groove 2120 and the elastic piece 41 is aligned with the groove 2120.

The ceiling plate 211 defines two slots 22. The first installing plate 131 includes an inserting portion 134 above the connection plate 133. The slot 32 is configured to receive the inserting portion 134 when the first fixing portion 31 is received in the first through hole 1352. When the first installing portion 31 slides from the first through hole 1352 to the second through hole 1351, the inserting portion 134 moves out of the slot 32.

The connection member 13 further includes two second installing plates 132 protruding from opposite edges of the two first installing plates 131. The second installing plate 132 defines a fastening hole 1320. An axis of the fastening hole 1320 is perpendicular to that of the connection hole 135.

The supporting structure 10 includes a support 11 and a fastening member 12 attached to the support 11. The fastening member 12 includes two fastening portions 121. The two fastening portions 121 are rotationally received in the two fastening holes 1320 to attach the connection member 13 to the supporting structure 10. Two pins 111 protruding from the end of the support 11. The fastening member 12 further defines two receiving holes 120 for receiving the two pins 111. An end of the support 11 defines a threaded hole 110. The fastening member 12 defines a through hole 123 aligned with the threaded hole 110. A bolt (not shown) passes through the through hole 123 to screw into the threaded hole 110 to attach the support 11 to the fastening member 12.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. An electronic device comprising:
    a supporting structure;
    a connection member attached to the supporting structure, the connection member comprising two first installing plates and a connection plate attached between the two first installing plates, the two first installing plates defines two connection holes;
    a supported element slidably attachable to the connection member;
        wherein, each connection hole comprising a first through hole portion and a second through hole portion, the second through hole portion positioned away from the supporting structure and having a greater diameter than the first through hole portion;
        wherein, the supported element comprises two or more fixing members slidably engagable with connection holes to attach the supported element to the connection element, each fixing member comprises a first fixing portion and a second fixing portion, the first fixing portion protrudes from the supported element with a first end attached to the supported element and a second end opposite the first end, the second fixing portion is attached to the second end of the first fixing portion, the fixing members slidably engages with the connection member by inserting the second fixing portion through the second through hole portion of a connection hole and sliding the first fixing portion into the first through hole portion of the connection hole;
    an elastic piece attached to the supported element, a protrusion protruding from the elastic piece, the connection plate supported by the protrusion when the first installing portion is received in the first through hole, and the elastic piece can be pressed to move away from the connection member to release the protrusion from the connection plate;
    wherein the supported element further comprises a ceiling plate perpendicular to the connection member, the elastic piece comprises a first end attached to the ceiling plate and a distal end opposite to the first end, a pressing portion protrudes from the distal end of the elastic piece to be pressed, the ceiling plate defines two slots, each first installing plate comprises an inserting portion above the connection plate, the slot is configured to receive the inserting portion when the first fixing portion is received in the first through hole.

2. The electronic device as claimed in claim 1, wherein the supported element further comprises a base plate parallel to the connection member, the ceiling plate protrudes from an edge of the base plate, the two first fixing portions protrudes from the base plate.

3. The electronic device as claimed in claim 2, wherein the base plate defines a groove aligned with the elastic piece for receiving the elastic piece.

4. The electronic device as claimed in claim 1, wherein the supporting structure comprises a support and a fastening member attached to the support, the fastening member is rotationally attached to the connection member.

5. The electronic device as claimed in claim 4, wherein the connection member defines two fastening holes, an axis of the fastening hole is perpendicular to that of the connection hole, the fastening member comprises two fastening portions aligned with the two fastening holes and rotationally received in the two fastening holes.

6. An electronic device comprising:
    a supporting structure;
    a connection member attached to the supporting structure, the connection member comprising two first installing plates and a connection plate attached between the two first installing plates, the two first installing plates defines two connection holes, each connection hole comprising a first through hole adjacent to the supporting structure and a second through hole away from the supporting structure, a diameter of the second through hole being greater than that of the first through hole;
    an elastic piece attached to the back shell, a protrusion protruding from the elastic piece, the connection plate supported by the protrusion when the first installing portion is received in the first through hole, and the elastic piece can be pressed to move away from the connection member to release the protrusion from the connection plate;
    a back shell comprising a ceiling plate perpendicular to the connection member, the elastic piece comprising a first end attached to the ceiling plate and a distal end opposite to the first end, a pressing portion protruding from the distal end of the elastic piece to be pressed, the ceiling plate defining two slots, each first installing plate comprising an inserting portion above the connection plate, the slot configured to receive the inserting portion when the first fixing portion is received in the first through hole;

two first fixing portions protruding from the back shell and being slidable between the two second through holes and the two first through holes; and two second fixing portions attached to the two first fixing portions, a diameter of the second fixing portion being smaller than that of the second through hole and being greater than that of the first through hole.

7. The electronic device as claimed in claim 6, wherein the back shell further comprises a base plate parallel to the connection member, the ceiling plate protrudes from an edge of the base plate, the two first fixing portions protrudes from the base plate.

8. The electronic device as claimed in claim 7, wherein the base plate defines a groove aligned with the elastic piece for receiving the elastic piece.

9. The electronic device as claimed in claim 6, wherein the supporting structure comprises a support and a fastening member attached to the support, the fastening member is rotationally attached to the connection member.

10. The electronic device as claimed in claim 9, wherein the connection member defines two fastening holes, an axis of the fastening hole is perpendicular to that of the connection hole, the fastening member comprises two fastening portions aligned with the two fastening holes and rotationally received in the two fastening holes.

11. The electronic device as claimed in claim 9, wherein two pins protrudes from the end of the support, the fastening member defines two receiving holes for receiving the two pins.

\* \* \* \* \*